United States Patent [19]

Hsieh

[11] Patent Number: 4,851,324

[45] Date of Patent: Jul. 25, 1989

[54] PHENOXY PROPANOL CONTAINING DEVELOPER COMPOSITIONS FOR LITHOGRAPHIC PLATES HAVING NEUTRAL PH

[75] Inventor: Shane Hsieh, Bridgewater, N.J.

[73] Assignee: Hoechst Celanese Corporation, Somerville, N.J.

[21] Appl. No.: 77,845

[22] Filed: Jul. 27, 1987

[51] Int. Cl.$^4$ .............................................. G03C 5/24
[52] U.S. Cl. .................................. 430/331; 430/302; 430/309
[58] Field of Search ........................ 430/331, 302, 309

[56] References Cited

U.S. PATENT DOCUMENTS

| 4,147,545 | 4/1979 | Rowe et al. ........................ 430/331 |
| 4,271,261 | 6/1981 | Shimizu et al. . |
| 4,308,340 | 12/1981 | Walls . |
| 4,780,396 | 2/1987 | Hsieh . |

FOREIGN PATENT DOCUMENTS

| 0043132 | 6/1981 | European Pat. Off. . |
| 6271958 | 4/1987 | Japan . |
| 2068136 | 8/1981 | United Kingdom . |

OTHER PUBLICATIONS

Chemical Abstracts, vol. 91, 1979, 91:220356q.

*Primary Examiner*—Paul R. Michl
*Assistant Examiner*—Mark R. Buscher
*Attorney, Agent, or Firm*—Plottel & Roberts

[57] ABSTRACT

A developer composition having a pH in the range of from about 6.5 to about 7.5 comprising in admixture:

(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and (b) from about 0.1% to about 30% by weight of the developer of one or more components selected from the group consisting of lithium salts of hydroxy, aryl and alkyl carboxylic acids; and (c) from about 0.1% to about 30% by weight of the developer of one or more compounds selected from the group consisting of potassium salts of hydroxy, aryl and alkyl carboxylic acids; and (d) from about 0.5% to about 3.0% based on the weight of the developer of an organic solvent composition, which organic solvent composition consists essentially of phenoxy propanol; and (e) an optional compatible organic or inorganic acid or base in an amount sufficient to adjust the pH of the developer composition into the range of from about 6.5 to about 7.5; and (f) an optional antifoam component in an amount of from about 0.02 to about 0.05% by weight of the developer; and (g) sufficient water to formulate an effective developer.

21 Claims, No Drawings

4,851,324

PHENOXY PROPANOL CONTAINING DEVELOPER COMPOSITIONS FOR LITHOGRAPHIC PLATES HAVING NEUTRAL PH

BACKGROUND OF THE INVENTION

The present invention relates to developer compositions for photographic elements comprising photosensitive coatings on substrates, or more particularly to developer compositions for removing the non-image areas of exposed, usually negative working lithographic printing plates containing diazonium salts.

In the past, various methods of developing printing plates have been employed. Such methods include the use of compositions containing organic solvents, surfactants, salts, acids and other art recognized materials in solution.

It is most desirable to have a developer composition which is capable of completing development in a short period of time. The oleophilic image areas of the printing plate should be ink receptive and water repellant whereas the hydrophilic non-image areas should be water receptive and greasy ink repellant.

The proper selection of the solvent in a developer solution is very important. If the selected solvent in a developer solution is a good solvent for the light sensitive composition itself, the solvent will not satisfactorily distinguish between the exposed areas and the unexposed areas. As a result, a large portion of the image area coating is dissolved in the solvent or is severely swollen and removed. Such printing plates have no practical value. By the addition of a large amount of water to reduce the concentration of the organic solvent in the developer solution, image differentiation can be improved. However, during the development of a printing plate, particularly in negative working plates, nonimage areas comprising resin binders such as acetals, and particularly polyvinyl formal, solvate in the developer solution and separate from the support and contract to spherical shapes in a highly tack condition. Such solvated particles deposit upon still-solvent-wet image areas and adhere permanently even after drying. Not only are these "redeposited" areas visible to the naked eye on the developed printing plate but are removed by tacky ink during printing which pulls away the true underimage, leaving skips which show as absence of image on the printed sheet.

To provide a partial solution to the problem, volatile solvents are used in many prior art developer compositions. It is expected that the use of such volatile solvents in the developer solution will prevent tackiness in the image by permitting rapid evaporation. However, use of large amounts of water miscible low boiling point solvents for example, as used in the developer described in U.S. Pat. No. 3,954,472, produce the problems of working sanitation, hazards due to low flash point, and pollution. A reduction of the concentration of these water miscible low boiling point solvents helps to minimize these problems in the working environment, however, the speed of development will be adversely affected. Also the tackiness of the coatings is reduced but not completely eliminated.

To improve the speed of development of developer solutions containing a lower concentration of low boiling points solvents, an adjuvant organic solvent is sometime added. Unfortunately, such developers suffer from several drawbacks including: toxicity, developer instability, odor or inability to effectively clean out unwanted background non-image areas.

Lithographic printing plates generally are composed of an aluminum containing substrate which may or may not have been treated with a variety processes recognized in the art process including anodization, graining and hydrophilization. The thusly prepared substrate may then be applied with a photosensitive coating comprising a photosensitizer, binding resins, colorants, acid stabilizers, surfactants and other art recognized components. Common photosensitizers include diazo compounds, including polymeric diazonium condensates salts and photopolymerizable compositions. Sensitizers, binders and printing plates employing aromatic diazonium compounds are described in U.S. Pat. Nos. 3,175,906; 3,046,118; 2,063,631; 2,667,415; 3,867,147 and 3,679,419. Typical prior art developer compositions are described in U.S. Pat. Nos. 2,754,279; 4,381,340 and German OLS No. 2,216,419.

Attempts have been made in the art to eliminate the low boiling solvent in the developer solution. U.S. Ser. No. 762,089 filed Aug. 2, 1985 describes a method to prepare a printing plate using polyvinyl alcohol-/acetate/acetal resins which can then be developed with aqueous solutions of salts and surfactants which are essentially neutral. These other aqueous solutions have been generally unsatisfactory due to foaming in processing equipment salt precipitation through water evaporation, insufficient developing capacity, and the presence of environment polluting phosphates. Others have been substantially acidic or basic, thereby making handling and disposal difficult.

The present invention improves upon the aforementioned drawbacks of other lithographic developers.

It is an object of this invention to provide a developer for lithographic printing plates which will enable the operator to prepare a plate with a developer having a small amount of a toxicologically acceptable organic solvent, and having a substantially neutral pH while simultanously achieving commercially acceptable removal of non-imaged areas.

SUMMARY OF THE INVENTION

The invention provides a developer composition having a pH in the range of from about 6.5 to about 7.5 comprising in admixture:

(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and (b) from about 0.1% to about 30% by weight of the developer of one or more components selected from the group consisting of lithium salts of hydroxy, aryl and alkyl carboxylic acids; and (c) from about 0.1% to about 30% by weight of the developer of one or more compounds selected from the group consisting of potassium salts of hydroxy, aryl and alkyl carboxylic acids; and (d) an optional compatible organic or inorganic acid or base in an amount sufficient to adjust the pH of the developer composition into the range of from about 6.5 to about 7.5; and (e) an optional antifoam component in an amount of up to about 0.05% by weight of the developer; and (f) from about 0.5% to about 3.0% based on the weight of the developer of an organic solvent composition, which organic solvent composition consists essentially of phenoxy propanol; and (g) sufficient water to formulate an effective developer.

The invention further provides a method for preparing a photographic element which comprises imagewise exposing a photographic element comprising a light sensitive negative working photographic composition disposed on a substrate with sufficient actinic radiation to form a latent image and then removing the non-image areas of said exposed element with a developer composition having a pH in the range of from about 6.5 to about 7.5 comprising in admixture:

(a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and (b) from about 0.1% to about 30% by weight of the developer of one or more components selected from the group consisting of lithium salts of hydroxy, aryl and alkyl carboxylic acids; and (c) from about 0.1% to about 30% by weight of the developer of one or more compounds selected from the group consisting of potassium salts of hydroxy, aryl and alkyl carboxylic acids; and (d) an optional compatible organic or inorganic acid or base in an amount sufficient to adjust the pH of the developer composition into the range of from about 6.5 to about 7.5; and (e) an optional antifoam component in an amount of up to about 0.05% by weight of the developer; and (f) from about 0.5% to about 3.0% based on the weight of the developer of an organic solvent composition, which organic solvent composition consists essentially of phenoxy propanol; and (g) sufficient water to formulate an effective developer.

DETAILED DESCRIPTION OF THE PREFERRED EMBODIMENT

As the first step in the production of negative working photographic elements such as lithographic printing plates, a sheet substrate such as aluminum compositions suitable for the manufacture of lithographic printing plates such as, Alcoa 3303 and Alcoa 1100, which may or may not have been pretreated by standard graining and/or etching and/or anodizing techniques as are well known in the art, and also may or may not have been treated with a composition, such as polyvinyl phosphonic acid, suitable for use as a hydrophilizing layer for lithographic plates is coated with a light sensitive polymeric diazonium salt or photopolymer containing composition. Such compositions may also contain binding resins, such as polyvinyl formal resins, colorants, acid stabilizers, surfactants, exposure indicators or other art recognized ingredients.

The photosensitive sheet material is then exposed to a suitable radiation source through a mask or transparency, and the exposed sheet then developed for removal of the non-image photosensitive materials.

The photosensitive coating mixture is usually prepared in a solvent composition which is compatible with all the other composition ingredients. The light sensitive composition is then coated on the substrate and the solvent dried off. Diazonium compounds most commonly employed in the preparation of light sensitive compositions suitable for the present application may be characterized by the generic structure A-$N_2^+X^-$, wherein A is an aromatic or heterocylic reside and X is the anion of an acid.

Specific examples of light sensitive diazonium materials useful as aforementioned include higher molecular weight compositions obtained, for example, by the condensation of certain aromatic diazonium salts in an acid condensation of certain aromatic carbonyl compounds such as formaldehyde, as disclosed for example in U.S. Pat. Nos. 2,063,631 and 2,667,415. A preferred class of diazonium compounds is described in U.S. Pat. No. 3,849,392. All of the foregoing patents are incorporated herein by reference.

A most preferred diazonium salt is the polycondensation product of 3-methoxy-4-diazo-diphenyl amine sulfate and 4,4'-bis-methoxy methyl-diphenyl ether, precipitated as the mesitylene sulfonate, as taught in U.S. Pat. No. 3,849,392.

Suitable photopolymerizable compositions are also well known to the skilled artisan.

The present invention provides a method for developing such exposed photosensitive elements by contacting them, to remove the non-image areas, using a developer which contains the aforementioned ingredients in an aqueous mixture. The mixture has a pH which is essentially neutral, that is, in the range of from about 6.5 to about 7.5, more preferably from about 6.5 to about 7.2 and most preferably from about 7.0 to about 7.2.

The developer contains an alkyl sulfate surfactant component which does not substantially foam when used in the developer of this invention. In the preferred embodiment this component is from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate. A more preferred range is from about 0.5% to about 15.0% and most preferably from about 3.0% to about 8.0%.

The developer also contains from about 0.1% to about 30% by weight of the developer of one or more lithium salts of hydroxy, aryl or alkyl carboxylic acid. A more preferred range is from about 1% to about 20% and most preferably from about 5% to about 10%. A typical example includes lithium benzoate, or the requisite salt may be formed by adding lithium hydroxide to an aqueous solution of the selected carboxylic acid.

The developer further contains from about 0.1% to about 30% by weight of the developer of one or more compounds selected from the group consisting of potassium salts of hydroxy, aryl or alkyl carboxylic acids. A more preferred range is from about 0.5% to about 20% and most preferably from about 1% to about 10%. Typical examples of the foregoing include potassium sorbate, potassium citrate, potassium succinate, and potassium maleate. Such are either available commercially or generated by adding potassium hydroxide to a solution of the selected carboxylic acid. In the preferred embodiment the ratio of lithium salt to potassium salt is from about 1:1 to 1: more than 1. Carboxylic acids useful for forming the lithium and potassium salts of this invention non-exclusively include sorbic acid, succinic acid, benzoic acid, D.L. malic acid, tartaric acid and citric acid.

The developer also contains from about 0.5% to about 3.0% based on the weight of the developer composition of phenoxy propanol; and preferably contains no other organic solvents. An amount below about 0.5% produces very low development speed, while amounts above about 3.0% produce unacceptable redeposit of removed particles back onto the plate surface. Phenoxy propanol is available commercially as Dowanol PPH from the Dow Chemical Company.

The developer also may optionally contain a compatible acid or base component in an amount to is an amount to adjust the pH of the developer into the desired range. Examples of the foregoing non-exclusively include D.L-glyceric acid, malic acid, tartaric cid, citric acid, galactanic acid, leuritic acid and 8, 9, 15-trihydroxy palmitic acid, and alkali metal hydroxides.

In the preferred embodiment, the developer of the present invention preferably contains optional minor amounts of a conventional antifoam component which aids in processing of the printing plate. This component, when it is used is preferably present in an amount of from about 0.02 to about 0.05% by weight of the developer.

In operation, the developer solution is often employed in a procesing machine wherein the solution may become contaminated by removed printing plate components. Such may cause an undesired pH fluctuation to the developer over time. It is therefore desired to provide the developer with an optional buffering component. In the preferred embodiment such prevent a pH fluctuation of more than about plus or minus two pH units from the pH of the uncontaminated developer solution. Non-exclusive examples of such are the alkali metal salts of citric, phosphoric, boric, barbituric, succinic and phthalic acids, as well as triethanol amine and tris (hydroxy methyl) amino ethane. Although the alkali metal phosphates do function as effective buffers, they are not preferred for environmental reasons. Sodium citrate is the most preferred buffer. Such are present in an amount sufficient to control fluctuation to plus or minus two pH units.

One preferred antifoam agent is Dow DB-31 which is a silicone type antifoam. The developer then contains sufficient water to formulate an effective developer. Optionally, one may add sufficient minor amounts of a compatible acid or base to adjust the pH of the developer into the desired range. The developer may also contain optional film formers. The developer is capable of substantially completely removing the non-image areas of a photographic element in about 2 minutes or less while simultaneously removing substantially none of the image areas. Substantially none of the material comprising said non-image areas is re-deposited back onto said photographic element.

It has been found that the foregoing formulation improves processing latitude, reduces lot variations and provides good speed of development without sacrificing length of run. In addition, it has been found that this developer is capable of developing many different types of plates having various categories of sensitizers and resin components. This is most advantageous since frequently a developer must be custom formulated every time a printing plate is improved. In addition, it is suitable for use in almost all known processing machines without adversely affecting the mechanism. Furthermore, it has been shown to have an extremely long developer life, i.e., up to twice as many plates can be processed prior to developer exhaustion as compared to other commercially known developers. The phenoxy propanol component has been shown to be an environmentally acceptable solvent which is capable of functioning in the developer formulation to remove the non-image areas of the plate, while not attacking the image areas. Other known developers employ environmentally unacceptable phenoxy ethanol.

The following non-limiting examples serve to illustrate the invention.

EXAMPLE 1

An ENCO ® A-30 negative working printing plate available commercially from Hoechst Celanese Corporation is imagewise exposed to actinic radiation in a manner well known to the skilled artisan. The thusly exposed plate is then washed with the following developer composition:

|  | Weight % |
| --- | --- |
| Water | 81.80 |
| Sodium Octyl Sulfate | 5.70 |
| Lithium Benzoate | 7.10 |
| Potassium Sorbate | 2.40 |
| Sodium Citrate | 1.00 |
| Citric Acid | 0.08 |
| DB-31 | 0.02 |
| Phenoxy propanol | 1.90 |

The plate develops cleanly a customary developing machine wihout noticeable background scumming or re-deposit of removed plate coatings.

EXAMPLE 2

Example 1 is repeated with the following developer composition:

|  | Weight % |
| --- | --- |
| Water | 80.98 |
| Sodium Octyl Sulfate | 6.00 |
| Lithium Benzoate | 7.90 |
| Potassium Malate | 4.00 |
| DB-31 | 0.02 |
| Dowanol PPH | 2.00 |

Similar results are noted.

EXAMPLE 3

Example 1 is repeated with the following developer composition:

|  | Weight % |
| --- | --- |
| DI Water | 82.78 |
| Lithium Succinate | 7.50 |
| Succinic Acid | 1.00 |
| Potassium Hydroxide | 1.00 |
| Sodium Octyl Sulfate | 5.70 |
| DB-31 | 0.02 |
| Dowanol PPH | 2.00 |

Similar results are noted.

EXAMPLE 4

Example 1 is repeated with the following developer composition:

|  | Weight % |
| --- | --- |
| DI Water | 81.79 |
| Lithium Citrate | 7.50 |
| Potassium Citrate | 2.50 |
| Citric Acid | 0.09 |
| Sodium Octyl Sulfate | 6.00 |
| DB-31 | 0.02 |

-continued

| | Weight % |
|---|---|
| Dowanol PPH | 2.00 |

Similar results are noted.

EXAMPLE 5

Example 1 is repeated with the following developer composition:

| | Weight % |
|---|---|
| DI Water | 82.58 |
| Lithium Benzoate | 7.50 |
| Potassium Citrate | 2.20 |
| Sodium Octyl Sulfate | 5.70 |
| Hydrochloric Acid | 2 drops |
| DB-31 | 0.02 |
| Dowanol PPH | 2.00 |

Similar results are noted.

EXAMPLE 6

Example 1 is repeated with the following developer composition:

| | Weight % |
|---|---|
| DB-31 | 82.89 |
| Lithium Benzoate | 7.50 |
| Potassium Hydroxide | 1.50 |
| D.L. - Malic Acid | 1.50 |
| Sodium Octyl Sulfate | 6.00 |
| DB-31 | 0.02 |
| Dowanol PPH | 2.00 |

Similar results are noted.

What is Claimed:

1. A developer composition having a pH in the range of from about 6.5 to about 7.5 comprising in admixture:
   (a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and
   (b) from about 0.1% to about 30% by weight of the developer of one or more components selected from the group consisting of lithium salts of hydroxy, aryl and alkyl carboxylic acids; and
   (c) from about 0.1% to about 30% by weight of the developer of one or more compounds selected from the group consisting of potassium salts of hydroxy, aryl and alkyl carboxylic acids; and
   (d) from about 0.5% to about 3.0% based on the weight of the developer of an organic solvent composition, which organic solvent composition consists essentially of phenoxy propanol; and
   (e) an optional compatible organic or inorganic acid or base in an amount sufficient to adjust the pH of the developer composition into the range of from about 6.5 to about 7.5; and
   (f) an optional antifoam component in an amount of from about 0.02 to about 0.05% by weight of the developer; and
   (g) an optional buffering component in an amount sufficient to maintain the developer in the above range, plus or minus two pH units; and
   (h) sufficient water to formulate an effective developer.

2. The developer of claim 1 wherein component (a) comprises sodium octyl sulfate.

3. The developer of claim 1 wherein component (b) comprises lithium benzoate.

4. The developer of claim 1 wherein component (c) comprises potassium sorbate.

5. The developer of claim 1 wherein component (e) comprises citric acid.

6. The developer of claim 1 wherein said component (g) comprises one or ore compounds selected from the group consisting of alkali metal salts of citric, phosphoric, boric, barbituric, succinic and phthalic acids, as well as triethanol amine and tris (hydroxy methyl) amino ethane.

7. The developer of claim 1 wherein said component (g) comprises sodium citrate.

8. The developer of claim 1 wherein component (a) is present in an amount of from about 0.5% to about 15.8% based on the weight of the developer composition.

9. The developer of claim 1 wherein component (b) is present in an amount of from about 1.0% to about 20.0% based on the weight of the developer composition.

10. The developer of claim 1 wherein component (c) is present in an amount of from about 0.5% to about 20.0% based on the weight of the developer composition.

11. The developer of claim 1 wherein said component (a) is present in an amount of from about 3.0% to about 8.0%, component (b) is present in an amount of from about 5.0% to about 10.0% and component (c) is present in an amount of from about 1.0% to about 10% based on the weight of the developer.

12. The developer of claim 1 wherein said component (a) comprises sodium octyl sulfate and is present in an amount of from about 3.0% to about 8.0%, component (b) comprises lithium benzoate and is present in an amount of from about 5.0% to about 10.0%, component (c) comprises potassium sorbate and is present in an amount of from about 1.0% to about 10% and component (d) comprises citric acid, said amounts based on the weight of the developer.

13. A method of treating a photographic element which comprises imagewise exposing a negative working photographic element to sufficient actinic radiation to form a latent image thereon, and then removing the non-image portions thereof with:

A developer composition having a pH in the range of from about 6.5 to about 7.5 comprising in admixture:
   (a) from about 0.1% to about 20% by weight of the developer of one or more compounds selected from the group consisting of sodium octyl sulfate, sodium tetradecyl sulfate, sodium 2-ethyl hexyl sulfate and ammonium lauryl sulfate; and
   (b) from about 0.1% to about 30% by weight of the developer of one or more components selected from the group consisting of lithium salts of hydroxy, aryl and alkyl carboxylic acids; and
   (c) from about 0.1% to about 30% by weight of the develбper of one or more compounds selected from the group consisting of potassium salts of hydroxy, aryl and alkyl carboxylic acids; and
   (d) from about 0.5% to about 3.0% based on the weight of the developer of an organic solvent composition, which organic solvent composition consists essentially of phenoxy propanol; and (e) an optional compatible organic or inorganic acid or base in an amount sufficient to adjust the pH of the developer composition into the range of from about 6.5 to about 7.5; and (f) an optional antifoam component in an amount of from about 0.02 to about 0.05% by weight of the developer; and (g) an optional buffering component in an amount sufficient to maintain the developer in the above range, plus or minus two pH units; and (h) sufficient water to formulate an effective developer.

14. The method of claim 13 wherein component (a) comprises sodium octyl sulfate.

15. The method of claim 13 wherein component (b) comprises lithium benzoate.

16. The method of claim 13 wherein component (c) comprises potassium sorbate.

17. The method of claim 13 wherein component (e) comprises citric acid.

18. The method of claim 13 wherein said component (g) comprises one or more compounds selected from the group consisting of alkali metal salts of citric, phosphoric, boric, barbituric, succinic and phthalic acids, as well as triethanol amine and tris (hydroxy methyl) amino ethane.

19. The method of claim 13 wherein said component (g) comprises sodium citrate.

20. The method of claim 13 wherein said component (a) is present in an amount of from about 3.0% to about 8.0%, component (b) is present in an amount of from about 5.0% to about 10.0% and component (c) is present in an amount of from about 1.0% to about 10% based on the weight of the developer.

21. The method of claim 13 wherein said component (a) comprises sodium octyl sulfate and is present in an amount of from about 3.0% to about 8.0%, component (b) comprises lithium benzoate and is present in an amount of from about 5.0% to about 10.0%, component (c) comprises potassium sorbate and is present in an amount of from about 1.0% to about 10% and component (d) comprises citric acid, said amounts based on the weight of the developer.

* * * * *